United States Patent [19]

Silvian

[11] Patent Number: 5,475,307
[45] Date of Patent: Dec. 12, 1995

[54] FREQUENCY DEMODULATOR AND METHOD FOR ASYNCHRONOUSLY DEMODULATING SAMPLE SIGNALS

[75] Inventor: Sergiu Silvian, La Crescenta, Calif.

[73] Assignee: Pacesetter, Inc., Sylmar, Calif.

[21] Appl. No.: 282,998

[22] Filed: Jul. 29, 1994

[51] Int. Cl.$^6$ ........................... H03D 3/00
[52] U.S. Cl. ............... 329/300; 375/324; 375/334
[58] Field of Search ........................... 329/300, 301, 329/302, 303, 341, 342, 343; 375/45, 46, 47, 48, 49, 50, 51, 80, 82, 88, 89, 90, 91

[56] References Cited

U.S. PATENT DOCUMENTS

| | | | |
|---|---|---|---|
| 3,846,708 | 11/1974 | Franco | 329/303 |
| 4,653,075 | 3/1987 | Wisniewski | 375/110 |
| 4,944,299 | 7/1990 | Silvian | 128/419 PG |
| 4,972,438 | 11/1990 | Silvian | 375/59 |
| 4,980,898 | 12/1990 | Silvian | 375/59 |
| 5,105,444 | 4/1992 | Gard | 329/300 X |
| 5,159,281 | 10/1992 | Hedstrom et al. | 329/312 |
| 5,163,071 | 11/1992 | Gelin | 375/114 |
| 5,170,414 | 12/1992 | Silvian | 375/59 |
| 5,227,741 | 7/1993 | Marchetto et al. | 332/101 X |
| 5,243,299 | 9/1993 | Marchetto et al. | 329/300 |
| 5,339,333 | 8/1994 | Zehngut et al. | 329/301 X |

*Primary Examiner*—David Mis
*Attorney, Agent, or Firm*—Malcolm J. Romano; Lisa P. Weinberg

[57] ABSTRACT

An improved digital frequency demodulator and method for demodulating a sampled asynchronous FM input signal that determines the time duration of each successive half cycle by counting the number of successive samples of the same polarity and by interpolating between the samples immediately before and immediately after the detected zero crossings at the beginning and the end of each half cycle.

7 Claims, 2 Drawing Sheets

FREQUENCY DEMODULATOR AND METHOD FOR ASYNCHRONOUSLY DEMODULATING SAMPLE SIGNALS

BACKGROUND OF THE INVENTION

This invention relates generally to frequency demodulators and, more particularly, to frequency demodulators for demodulating input signals that are sampled asynchronously.

Analog and digital signals frequently are transmitted over communication channels using frequency modulation (FM) encoding. Information is extracted from the modulated signals using frequency demodulators. In the case of digital FM, or frequency-shift keying (FSK), one distinct frequency represents a "0" bit and another distinct frequency represents a "1" bit. Demodulating an FSK signal does not require a precision FSK demodulator, because the demodulator merely must decide for each bit whether the signal's frequency is below or above a particular center frequency threshold. In the case of analog FM, on the other hand, a continuum of frequencies must be detected and a precision demodulator is required for the modulating signal to be accurately recovered.

In such an analog FM system, the frequency of the modulated input signal can be detected by measuring the time duration between successive zero crossings. Such time duration measurements are readily made when the FM system is a continuous time system; however, that is not the case for discrete time systems, such as systems that use digital signal processors, in which case the modulated input signal is sampled at a rate that is asynchronous with the input signal. Signal samples therefore are available only at discrete times not necessarily coincident with the zero crossings.

Discrete time FM systems in the past have used an adaptive bandpass filter that is made to search for the frequency of the input signal. The filter coefficients are repeatedly adjusted so as to maximize the amplitude of the filtered signal. Although systems of this kind have been generally effective, they are considered to require excessive processing time and complexity.

It should be appreciated from the foregoing description that there is a continuing need for a frequency demodulator for a discrete time FM system that can accurately demodulate an analog FM signal without the need for excessive data processing and its consequent delays. The present invention fulfills this need.

SUMMARY OF THE INVENTION

The present invention resides in an improved digital frequency demodulator for demodulating an asynchronously sampled frequency-modulated (FM) input signal, accurately, efficiently and with substantially reduced processing time. The method includes steps of comparing each input signal sample with its immediately preceding sample, to determine when the samples have opposite polarities relative to a mean (typically zero), and then estimating the time at which the input signal corresponds to the mean by interpolating between each successive pair of samples having different polarities. The time duration between successive time estimates is then determined, and the input signal's frequency is then calculated based on these time duration determinations.

In a more detailed feature of the invention, the step of interpolating between successive pairs of samples having different polarities includes a step of assuming that the input signal varies substantially linearly during the time between such samples. This greatly minimizes processing complexity without any substantial degradation in performance. The time duration between successive mean crossings is advantageously determined according to the following formula:

Time Duration, $t = \Delta t_{first} + NT + \Delta t_{last}$ where:
N=No. of samples of same polarity during $n^{th}$ half cycle,
T=Time period between successive samples, $$\Delta t_{first} = \text{Time duration from interpolated mean crossing to first sample of } n^{th} \text{ half cycle,}$$
$$= \frac{|A_{first}|}{|A_{first}| + |A_{previous}|} T,$$

$$\Delta t_{last} = \text{Time duration from last sample of } n^{th} \text{ half cycle to interpolated mean crossing,}$$
$$= \frac{|A_{last}|}{|A_{last}| + |A_{next}|} T,$$

$A_{first}$=First sample of $n^{th}$ half cycle,
$A_{prev}$=Sample previous to $A_{first}$,
$A_{last}$=Last sample of $n^{th}$ half cycle,
$A_{next}$=Sample after $A_{last}$.

In another more detailed feature of the invention, the step of calculating the input signal's frequency can include a step of averaging or low-pass filtering a predetermined plurality of successive time durations between successive mean crossings, thus minimizing the output signal noise.

Other features and advantages of the present invention should become apparent from the following description of the preferred embodiment and method, taken in conjunction with the accompanying drawings, which illustrate, by way of example, the principles of the invention.

DESCRIPTION OF THE PREFERRED EMBODIMENT AND METHOD

Figure 1:
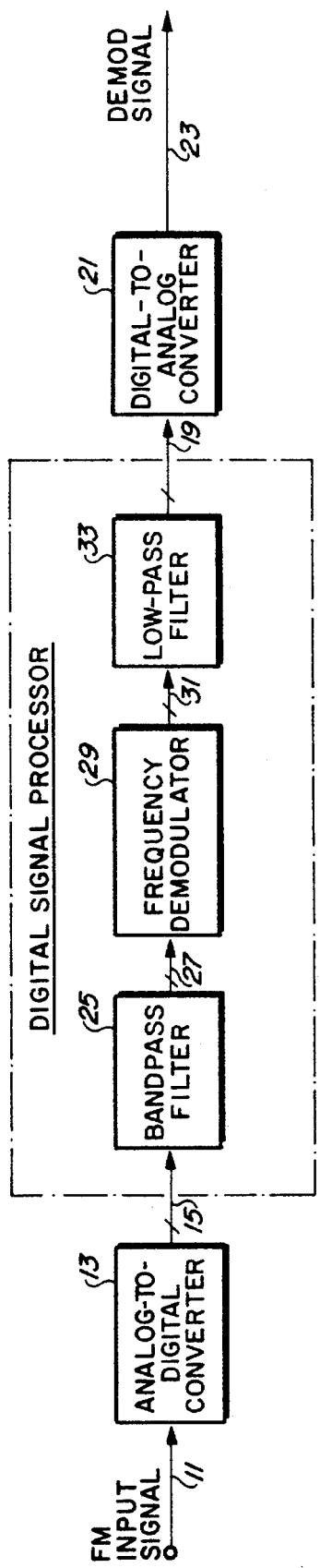
FIG. 1 is a simplified block diagram of a digital frequency demodulator embodying the present invention.

With reference now to the illustrative drawings, and particularly to FIG. 1, there is shown a digital frequency demodulator for demodulating a frequency-modulated (FM) input signal. The FM input signal is received on line 11 by an analog-to-digital (A/D) converter 13, which samples the signal at regular time intervals and produces a sequence of multi-bit words. The digitized sample sequence is transmitted on lines 15 to a digital signal processor (DSP) 17, for bandpass filtering and frequency demodulation. The DSP, in turn, outputs a sequence of digital words that represent the demodulated, baseband signal. This demodulated signal is transmitted on lines 19 to a digital-to-analog (D/A) converter 21, for conversion back to an analog format. The analog demodulated signal is provided as a demodulated output signal on line 23.

As mentioned above, the DSP 17 performs two principal functions on the digitized FM input signal received on lines 15. These functions include bandpass filtering and frequency demodulation. Both are accomplished using software, but are depicted in the block diagram of FIG. 1 as equivalent hardware components. In particular, a bandpass filter 25 is shown to receive the digitized FM input signal on lines 15, producing a filtered digitized signal supplied on lines 27 to a frequency demodulator 29. The frequency demodulator demodulates the filtered signal and produces a demodulated signal that is supplied on lines 31 to a low-pass filter 33. The filter, in turn, produces the digitized baseband signal output by the DSP on lines 19.

If the bandpass filter 25 were receiving a continuous FM input signal, a frequency determination could be obtained simply by measuring the time delay from each zero crossing to the next. Such a technique cannot be used in the frequency demodulator of FIG. 1, however, because the bandpass filter operates on a digitized FM input signal for which the successive digitized samples are asynchronous with the FM input signal. This is evident in FIG. 2, which depicts one full cycle of the FM input signal, with indications of the successive samples being shown not to coincide with any of the successive zero crossings. Each zero crossing can occur at any time between two successive samples.

The frequency demodulator 29 of FIG. 1 determines the input signal's frequency by measuring the approximate duration of each half cycle and then time averaging or low-pass filtering a predetermined number of such measurements. Each measurement is determined by counting the number of samples that occur during each half cycle and by interpolating between the two samples that occur immediately before and immediately after each zero crossing at the beginning and ending of each half cycle.

Figure 2:
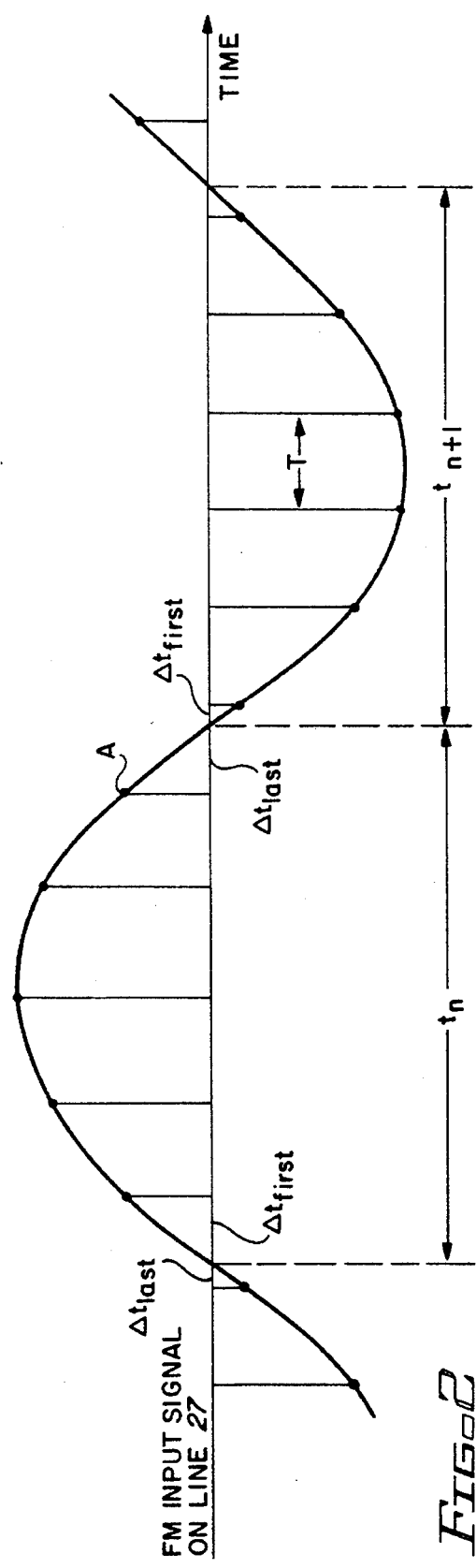
FIG. 2 is a simplified diagram of one full cycle of the frequency-modulated input signal and the discrete signal samples produced by the asynchronous analog-to-digital converter of FIG. 1.

With reference to FIG. 2, it is noted that the successive samples of the signal being made by the A/D converter 13 occur at intervals of T, asynchronous with the successive zero crossings. In the first depicted half cycle, designated half cycle number n, five such samples are made, representing a duration of 5T. In addition, a partial period $\Delta t_{first}$ occurs at the beginning of the depicted half cycle n, and a partial period $\Delta t_{last}$ occurs at the end of the depicted half cycle n.

The frequency demodulator 29 determines the total duration of the half cycle n by interpolating between the two samples (i.e., $A_{prev}$ and $A_{first}$, or $A_{last}$ and $A_{next}$) occurring immediately before and after each zero crossing and by then summing together the appropriate interpolated values with a count of the number of the full sample periods, i.e., $\Delta t_{first}$+ NT+$\Delta t_{last}$. The interpolation assumes that the FM input signal varies substantially linearly between the successive samples occurring immediately before and after each zero crossing. The interpolating thus uses the following formula:

$$\Delta t_{first} = \frac{|A_{first}|}{|A_{first}| + |A_{prev}|} T$$

-continued $$\Delta t_{last} = \frac{|A_{last}|}{|A_{last}| + |A_{next}|} T$$

These half-cycle duration calculations are computed for each successive half cycle of the digitized FM input signal. Based on these successive calculations, an estimate of the FM input signal's instantaneous frequency can be obtained. Appropriate averaging or low-pass filtering of successive calculations can minimize the possibility that superimposed noise will cause incorrect frequency estimates.

As an alternative to a linear interpolation between successive samples occurring immediately before and after each zero crossing, the interpolation can utilize a recognition that the modulated signal varies substantially sinusoidally, according to the equation: $A(t)=K \sin(\omega t)$. Although such a non-linear interpolation will provide a more accurate estimate of the signal's zero crossing, the increased accuracy is not ordinarily considered sufficient to overcome the drawback of increased complexity.

Figure 3:
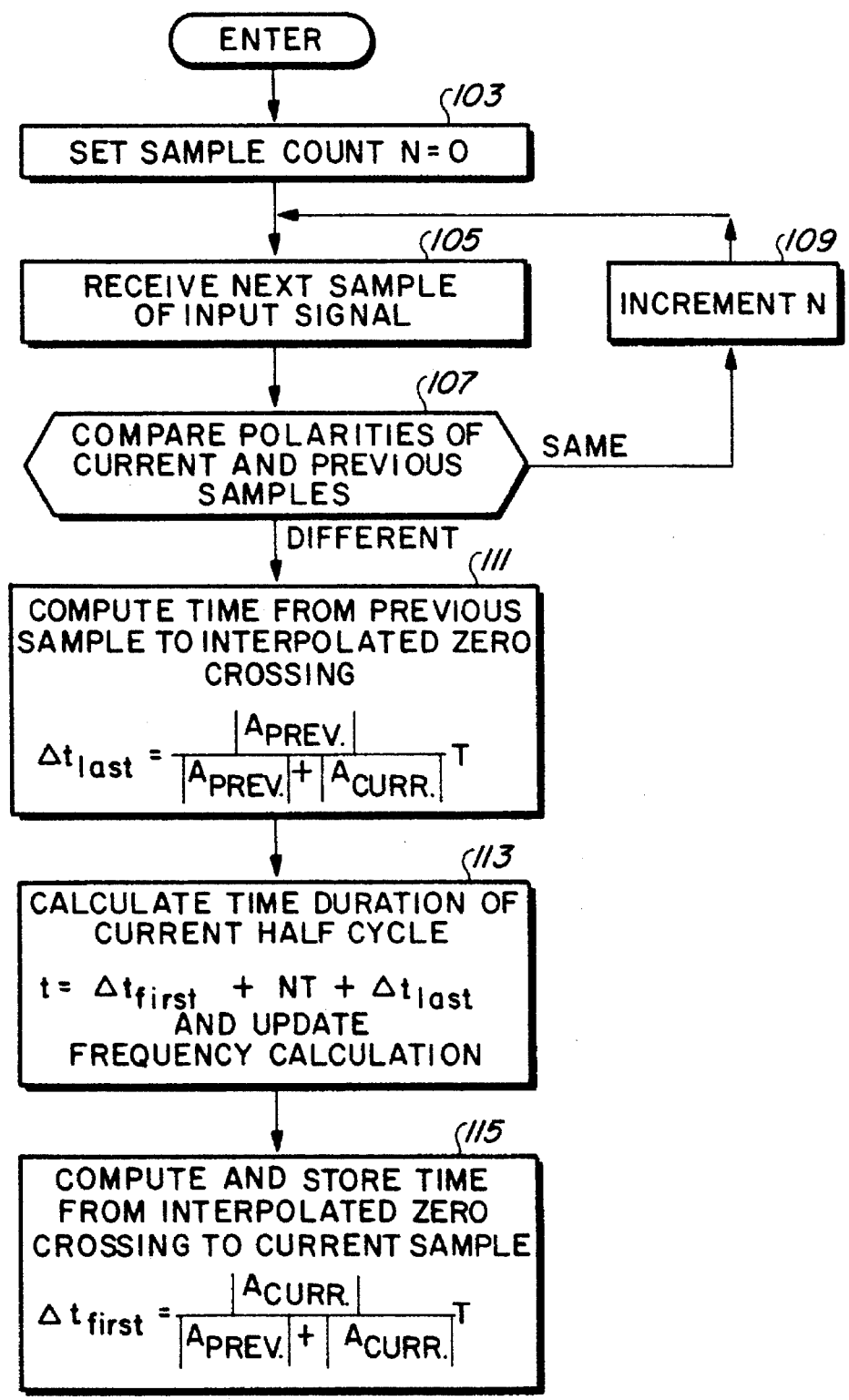
FIG. 3 is a simplified flowchart showing the operational steps performed by the digital signal processor of the demodulator of FIG. 1, in frequency demodulating the successive discrete signal samples.

Implementation of the frequency demodulator 29 of the DSP 17 can be understood more fully with reference to the flowchart of FIG. 3. In an initial step 103, the count of the samples N accumulated for the current half cycle is set to an initial value of zero. In step 105, the frequency demodulator receives the next digitized sample of the bandpass filtered input signal and, in step 107, it compares the polarities of the current and previous samples. If the samples are determined to be of the same polarity, the sample count N is incremented by one unit, at step 109, and the program returns to step 105 of receiving the next input signal sample.

Eventually, it will be determined in step 107 that the polarities of the current and previous samples are different, meaning that a zero crossing of the FM input signal has occurred during the previous sample period T. The program then proceeds to step 111, in which the time delay from the previous sample to the interpolated zero crossing is computed according to the following formula:

$$\Delta t = \frac{|A_{prev}|}{|A_{prev}| + |A_{curr}|} T$$

This corresponds to $\Delta t_{last}$ for the half cycle just completed. Subsequently, in step 113, the frequency demodulator 29 calculates the time duration of the half cycle just completed according to the following formula, which incorporates $\Delta t_{first}$ computed during a previous pass through the flowchart:

$$t = \Delta t_{first} + NT + \Delta t_{last}$$

Subsequently, in step 115, the frequency demodulator 29 computes the time delay from the interpolated zero crossing to the current sample time according to the following formula:

$$\Delta t = \frac{|A_{curr}|}{|A_{prev}| + |A_{curr}|} T$$

Also in step 115, it stores the computed value as $\Delta t_{first}$, for subsequent use in determining the total time duration of the next succeeding half cycle of the FM input signal.

Subsequently, the frequency demodulator 29 returns to the step 103 of setting the current sample count N to zero. The same steps 105–115 are then followed in connection with the next half cycle, to provide a further time duration measurement and frequency calculation.

It should be appreciated from the foregoing description that the present invention provides an improved digital frequency demodulator and method for demodulating an asynchronous FM input signal that provides accurate estimates of the time duration of each successive half cycle so that an accurate estimate of the signal's instantaneous frequency can be provided. This facilitates an effective demodulation of the input signal, without the need for excessive signal processing.

Although the invention has been described in detail with reference only to the presently preferred embodiment and method, those of ordinary skill in the art will appreciate that various modifications can be made without departing from the invention. Accordingly, the invention is defined only by the following claims.

What is claimed is:

1. In a digital frequency demodulator that includes an analog-to-digital converter for sampling a frequency-modulated input signal at regular time intervals, to produce a sequence of samples, wherein the input signal deviates about a mean, a method comprising the steps of:

comparing each sample with its immediately preceding sample and determining when the samples have opposite polarities relative to the mean;

interpolating between each successive pair of samples determined in the step of comparing to have different polarities, to estimate the time at which the input signal corresponds to the mean;

determining the time duration between successive time estimates estimated in the step of interpolating;

calculating the frequency of the input signal based on the time durations determined in the step of determining.

2. A method, as defined in claim 1, wherein the step of calculating includes steps of:

averaging a predetermined plurality of successive time durations determined in the step of determining, to determine an average time duration; and calculating the frequency of the input signal based on the average time duration determined in the step of averaging.

3. A method, as defined in claim 1, wherein the step of interpolating includes a step of assuming that the input signal varies substantially linearly during the time between each successive pair of samples having different polarities.

4. A method, as defined in claim 1, wherein the steps of interpolating and determining determine the time duration between each successive pair of samples having different polarities according to the following formula:

Time Duration, $t = \Delta t_{first} + NT + \Delta t_{last}$ where:

N=No. of samples of same polarity between polarity transitions,
T=Time period between successive samples, $\Delta t_{first}$ = Time duration from interpolated mean crossing to first sample of $n^{th}$ half cycle, $= \dfrac{|A_{first}|}{|A_{first}| + |A_{previous}|} T,$ -continued $\Delta t_{last}$ = Time duration from last sample of $n^{th}$ half cycle to interpolated mean crossing, $= \dfrac{|A_{last}|}{|A_{last}| + |A_{next}|} T,$ $A_{first}$=First sample of $n^{th}$ half cycle,
$A_{prev}$=Sample previous to $A_{first}$,
$A_{last}$=Last sample of $n^{th}$ half cycle,
$A_{next}$=Sample after $A_{last}$.

5. A digital frequency demodulator comprising:

an analog-to-digital converter for sampling a frequency-modulated input signal at regular time intervals, to produce a sequence of samples, the input signal deviating about a predetermined mean;

a comparator for comparing each sample with its immediately preceding sample, to determine when the samples have opposite polarities relative to the mean;

an interpolator for examining each successive pair of samples determined by the comparator to have opposite polarities relative to the mean, to estimate the particular time at which the input signal corresponds to the mean; and a processor for determining the time duration between successive time estimates estimated by the interpolator, which represents the time durations of the successive half cycles of the input signal, and for updating a calculation of the input signal's frequency.

6. A digital frequency demodulator, as defined in claim 5, wherein the interpolator is configured to estimate the time at which the input signal corresponds to the mean by assuming that the signal varies substantially linearly during the time between the two samples determined to have opposite polarities relative to the mean.

7. A digital frequency demodulator comprising:

an analog-to-digital converter for sampling a frequency-modulated input signal at regular time intervals, to produce a sequence of samples, the input signal deviating about a predetermined mean;

a comparator for comparing each sample with its immediately preceding sample, to determine when the samples have opposite polarities relative to the mean, and thus the particular sample period during which the input signal crosses through the mean; and a processor for determining the time durations between successive mean crossings of the input signal, according to the following formula for the $n^{th}$ half cycle:

Time Duration, $t = \Delta t_{first} + NT + \Delta t_{last}$ where:

N=No. of samples of same polarity during $n^{th}$ half cycle,
Time period between successive samples, $\Delta t_{first}$ = Time duration from interpolated mean crossing to first sample of $n^{th}$ half cycle, $= \dfrac{|A_{first}|}{|A_{first}| + |A_{previous}|} T,$ -continued $\Delta t_{last}$ = Time duration from last sample of $n^{th}$ half cycle to interpolated mean crossing, $$= \frac{|A_{last}|}{|A_{last}| + |A_{next}|} T,$$

$A_{first}$=First sample of $n^{th}$ half cycle,
$A_{prev}$=Sample previous to $A_{first}$,
$A_{last}$=Last sample of $n^{th}$ half cycle,
$A_{next}$=Sample after $A_{last}$;

wherein the processor further is configured to repeatedly update a calculation of the input signal's frequency based on the successive half-cycle time duration determinations.

* * * * *